United States Patent
Endo et al.

(10) Patent No.: US 6,849,832 B2
(45) Date of Patent: Feb. 1, 2005

(54) EVAPORATION APPARATUS

(75) Inventors: Tetsuro Endo, Ota (JP); Hirotoshi Iwase, Gunma (JP); Seizo Kato, Ogaki (JP); Masatoshi Ochiai, Mizuho (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/838,484

(22) Filed: May 4, 2004

(65) Prior Publication Data

US 2004/0223750 A1 Nov. 11, 2004

(30) Foreign Application Priority Data

May 8, 2003 (JP) ........................................ 2003-130714
Apr. 5, 2004 (JP) ........................................ 2004-111434

(51) Int. Cl.[7] ........................ C23C 16/00; C23C 14/00; F27B 14/12; F27B 14/14
(52) U.S. Cl. ........................ 219/426; 219/421; 219/438; 118/726
(58) Field of Search ................................. 219/420, 421, 219/426, 438; 118/726, 727

(56) References Cited

U.S. PATENT DOCUMENTS 4,543,467 A * 9/1985 Eisele et al. ................. 118/726
6,562,405 B2 * 5/2003 Eser et al. .................... 118/726

FOREIGN PATENT DOCUMENTS

JP 2001-247959 9/2001

* cited by examiner

*Primary Examiner*—Joseph Pelham
(74) *Attorney, Agent, or Firm*—Cantor Colburn LLP

(57) ABSTRACT

When electric current is caused to flow in an electric heater which is disposed on an elongated crucible, an evaporation material stored within the crucible and located under the electric heater is heated and the evaporation material is vaporized and discharged through an opening of the electric heater. Because a metal coating is applied to the outer surface of the elongated crucible, external radiation of heat from the crucible is reduced, and the heat generated by the electric heater is more efficiently used to increase the temperature of the evaporation material. In this manner, efficient heating for the interior of the elongated crucible and uniform temperature within the crucible can be achieved.

13 Claims, 10 Drawing Sheets

EVAPORATION APPARATUS

CROSS-REFERENCE TO RELATED APPLICATIONS

The Japanese priority applications Numbers 2003-130714 and 2004-111434 upon which this patent application is based are hereby incorporated by reference.

BACKGROUND OF THE INVENTION

1. Field of the Invention

The present invention relates to an evaporation apparatus, and more particularly to an evaporation apparatus which functions as an evaporation source for supplying an evaporation material which is heated and evaporated to a deposition target.

2. Description of Related Art

Conventionally, evaporation (in particular, vacuum evaporation) has been used widely for formation of thin films made of various materials. For example, in organic electroluminescence (hereinafter abbreviated as "EL") displays, which have attracted attention as a possible replacement for liquid crystal displays and which have been developed for practical use, vacuum evaporation is commonly used for forming an organic thin film and a metal electrode layer used in an emissive layer of an organic EL element of such a display panel.

A vacuum evaporation apparatus includes a crucible having high heat resistance and excellent chemical stability within an evaporation chamber. A deposition material (evaporation material) placed in the crucible is heated and evaporated to thereby form a deposition layer on a deposition target. Conventional vacuum evaporation apparatuses employ a single point-like evaporation source, which discharges the evaporation material in the radial directions toward the deposition target surface for forming a layer thereon.

There is meanwhile continuous demand for displays, including organic EL displays, having ever larger areas. An evaporation apparatus used for an organic EL display must therefore accommodate larger panel substrates on which an element is formed, in other words, the apparatus must accommodate an increased deposition area.

On the other hand, for medium or small size panels, a so-called gang printing technology is often used, in which a plurality of panels are simultaneously formed on a single large substrate (mother substrate) and are separated as individual panels later. For these medium and small panels manufactured by gang printing, reduction of manufacturing cost requires that the size of each mother substrate be increased, to increase the number of panels which can be formed simultaneously. For the manufacture of such panels, as in the large display panels described above, it is necessary to accommodate an enlarged deposition area because evaporation is performed for a large mother substrate.

When a single point evaporation source as described above is used for evaporation with respect to a large area as described above, the distance between the evaporation source to a film forming position significantly varies depending on the position of the deposition target substrate, which hinders formation of a uniform deposition layer on the substrate. To address this problem, Japanese Patent Laid-Open Publication No. 2001-247959, for example, suggests using an elongate evaporation source, which is so-called linear source. Use of such a linear source reduces variations in differences between each position of the substrate and the linear source, thereby enhancing the uniformity of evaporation conditions with respect to a substrate having a large area.

Because any variations in emission brightness and emissive color significantly affect the quality of a display, uniformity of emission brightness or the like is a strong requirement of all displays, including organic EL displays. However, as described above, when manufacturing an organic EL display, an emissive layer, an organic layer such as a charge transport layer and a charge injection layer, and a metal electrode are formed using a vacuum evaporation method. Because an organic layer is a very thin film, any variation in the film thickness has a relatively very large effect on a variation in the emissive brightness and emissive color. Further, because an organic layer is formed between an anode and a cathode, any variation in the thickness of the organic layer has the possibility of creating a display defect such as short-circuit formed between the anode and the cathode. Accordingly, an evaporation apparatus which is used for such an organic EL display or the like, for example, requires that a deposition layer be formed on a large area with very high accuracy.

When a linear source as described above is used for manufacturing an organic EL element, deposition of a film onto a large substrate would be easy. However, even when a linear source is simply used to form an organic layer or the like using evaporation, the characteristics of the resultant organic EL element significantly vary and it is not possible to realize the uniformity required for practical use of an organic EL display.

The applicant of the present invention researched and studied causes of variation in the element characteristics described above and found that a major factor thereof is that discharge of a deposition material is not uniform along the longitudinal direction of an evaporation source when a linear source is used as the evaporation source. In order to form a uniform deposition layer on a wide deposition surface, it is necessary

SUMMARY OF THE INVENTION

The present invention therefore provides an evaporation apparatus capable of discharging an evaporation material uniformly from any position of an elongated crucible.

In accordance with one aspect of the present invention, there is provided an evaporation apparatus comprising an elongated crucible having an upper opening and storing an evaporation material and an electric heater which covers the upper opening of the elongated crucible, generates heat by causing electric current to flow therein for heating the evaporation material stored in the crucible, and has an opening through which can pass the evaporation material which is vaporized by heating, wherein a metal coating is applied to the outer surface of the elongated crucible.

Because a metal coating is applied to the crucible as described above, heat radiated externally from the crucible is reduced, so that heat generated by the electric heater can raise the temperature of the evaporation material with high efficiency. It is therefore possible to evaporate the evaporation material without unnecessarily raising the temperature of the electric heater, and to increase uniformity of the temperature within the crucible. Further, due to the uniform temperature within the crucible, the evaporation material vaporizes uniformly in the longitudinal direction within the crucible, and the evaporated product is discharged uniformly over the longitudinal direction through the openings of the electric heater. By moving the evaporation apparatus relative to the substrate in the direction perpendicular to the longitudinal direction of the crucible, the evaporation product can be deposited uniformly onto the substrate, so that a thin film having a uniform thickness can be formed on the substrate.

Further, in accordance with another aspect of the present invention, the metal coating is preferably an aluminum material.

An aluminum material has high reflectivity, and therefore can store radiated heat within the crucible with high efficiency. An aluminum material also has high thermal conductivity and therefore can heat the whole crucible uniformly. In addition, an aluminum material is advantageous in that it is inexpensive and can be easily sprayed by heating.

Further, in accordance with a further aspect of the present invention, the metal coating is preferably applied from the bottom of the crucible to a substantially uniform height of side walls of the crucible.

Also, in accordance with a still further aspect of the present invention, the metal coating is formed by thermal spraying.

Moreover, in accordance with another aspect, the present invention concerns an evaporation apparatus for evaporating and depositing an evaporation material to a target object.

As described above, according to the present invention, because a metal coating is applied to the elongated crucible, heat radiated from the crucible is reduced, and heat generated by the electric heater is therefore more efficiently used to raise the temperature of the evaporation material. It is therefore possible to heat and evaporate the evaporation material without unnecessarily raising the temperature of the electric heater, and to enhance the uniformity of the temperature within the crucible. Further, due to the uniform temperature within the crucible, the evaporation material vaporizes uniformly in the longitudinal direction within the crucible, and the evaporated product is discharged uniformly over the longitudinal direction through the openings of the electric heater. By moving the above evaporation apparatus relative to the substrate in the direction perpendicular to the longitudinal direction of the crucible, a thin film having a uniform thickness can be formed on the substrate.

In another aspect of the present invention, there is provided an evaporation apparatus comprising an elongated crucible having an upper opening and storing an evaporation material, an electric heater which covers the upper opening of the elongated crucible, generates heat by causing electric current to flow therein for heating the evaporation material stored in the crucible, and has an opening through which can pass the evaporation material which is vaporized by heating, and a fixing member for pressing and fixing the electric heater onto the elongated crucible, wherein a metal coating is applied to the outer surface of the elongated crucible, between the fixing member and the electric heater, an angle member, which has surface portions respectively fitting onto an edge portion of the upper surface and an upper portion of the side surface of the electric heater and is insulative at least in a surface thereof, is provided along the longitudinal direction of the elongated crucible, and pressing force from the fixing member is caused to exert onto the electric heater via the angle member for bringing the electric heater into close contact with the elongated crucible.

In accordance with another aspect of the present invention, in the above evaporation apparatus, the angle member is longer than a pressing portion of the fixing member which presses the angle member in the longitudinal direction of the crucible.

In accordance with still another aspect of the present invention, in the above evaporation apparatus, the angle member is formed of a material having a lower thermal conductivity than the fixing member.

As described above, by electrically insulating the fixing member and the electric heater using an insulative angle member, it is possible to prevent the electric heater and the metal coating electrically connected to the fixing member from electrically connecting, and therefore prevent electric current, which can cause heat generation and deterioration, from flowing in the metal coating.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described with reference to the drawings.

Figure 1:
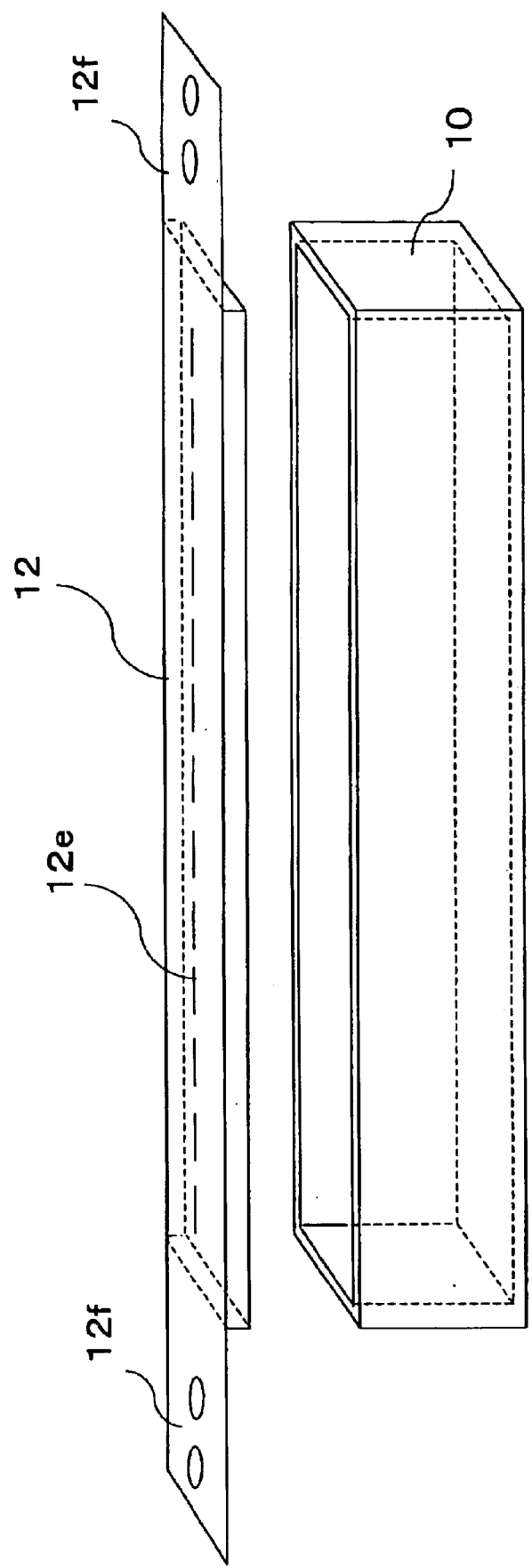
FIG. 1 is a view showing the overall structure of an evaporation apparatus in accordance with one embodiment of the present invention.

FIG. 1 shows the structure of an evaporation apparatus according to an embodiment of the present invention. An elongated crucible 10 is a container having an upper opening and storing an evaporation material. The crucible 10 has a roughly rectangular solid shape, and is formed from quartz, for example, With a hollow interior. The crucible 10 may be formed by removing the interior of a bar of quartz, or may be molded. The crucible 10 has a length of about 60 cm, a height of about 4 cm, and width of about 4 cm, for example, but the size may be determined in accordance with the size of the deposition target, such as an organic EL substrate.

The upper potion of the crucible 10 is covered with and sealed by an electric heater 12. The electric heater 12 is formed of tantalum (Ta), for example, and generates heat when electric current flows from a power source which is connected to tongue portions 12f extending at both ends in the longitudinal direction of the electric heater 12. Although the electric current is typically direct current, it may be alternating current. Further, the predetermined number of slit-like openings 12e are provided at middle points in the width direction of the electric heater 12 along the longitudinal direction thereof, and evaporation materials are discharged through these openings 12e.

Figure 2:
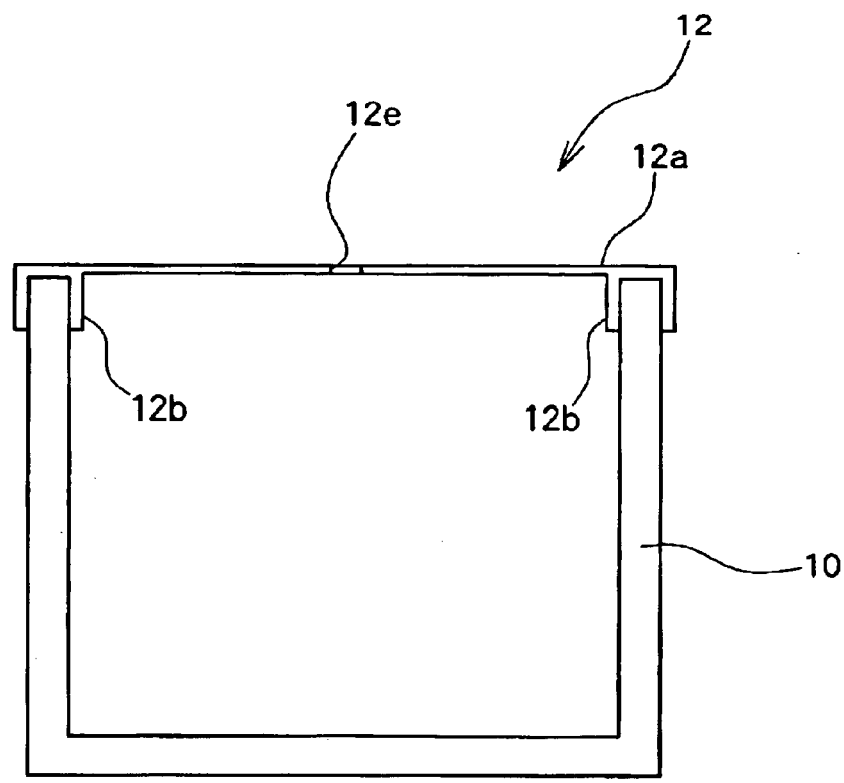
FIG. 2 is a cross sectional view showing the structure of an electric heater covering an opening of a crucible.

As shown in FIG. 2, the electric heater 12 includes a body 12a having side walls formed by bending peripheral portions of the body downward and flange portions 12b which are formed in the peripheral portions of the body 12a at positions toward inner side away from the side walls by a predetermined distance and which are formed downward similar to the side walls. The flange portion 12b is welded so as to project downward from the peripheral portion of the body 12a, such that the flange portion 12b sandwiches the upper end of the crucible 10 together with the side wall of the body 12a. More specifically, the flange portion 12b and the side wall of the body 12a form a groove in the peripheral portion of the body, into which the upper end of the crucible 10 is inserted.

Figure 3:
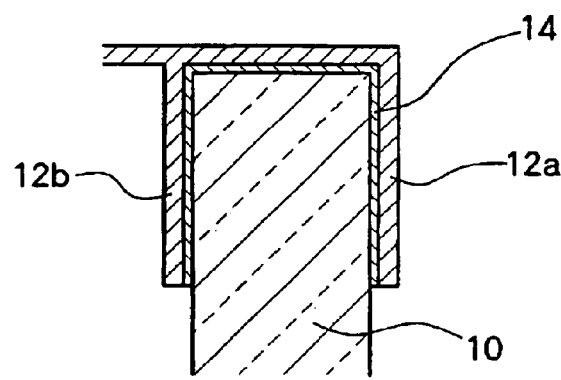
FIG. 3 is an enlarged view showing the portion of the heater shown in FIG. 2 where the crucible and the electric heater engage with each other.

As shown in FIG. 3, in the above-described groove formed by the flange portion 12b and the side wall, a carbon sheet member 14 made of woven or nonwoven fabric, such as Grafoil (trademark), is provided between the upper end of the crucible 10 and the electric heater 12 and serves as a packing.

A predetermined number of openings 12e are formed in the center portion of the body 12a. More specifically, a plurality of openings 12e are linearly arranged aligned with each other along the longitudinal direction of the crucible 10. The opening 12e has a slit shape, which is an extremely elongated shape, so that an evaporated material can be deposited within the predetermined range on the substrate.

Figure 4:
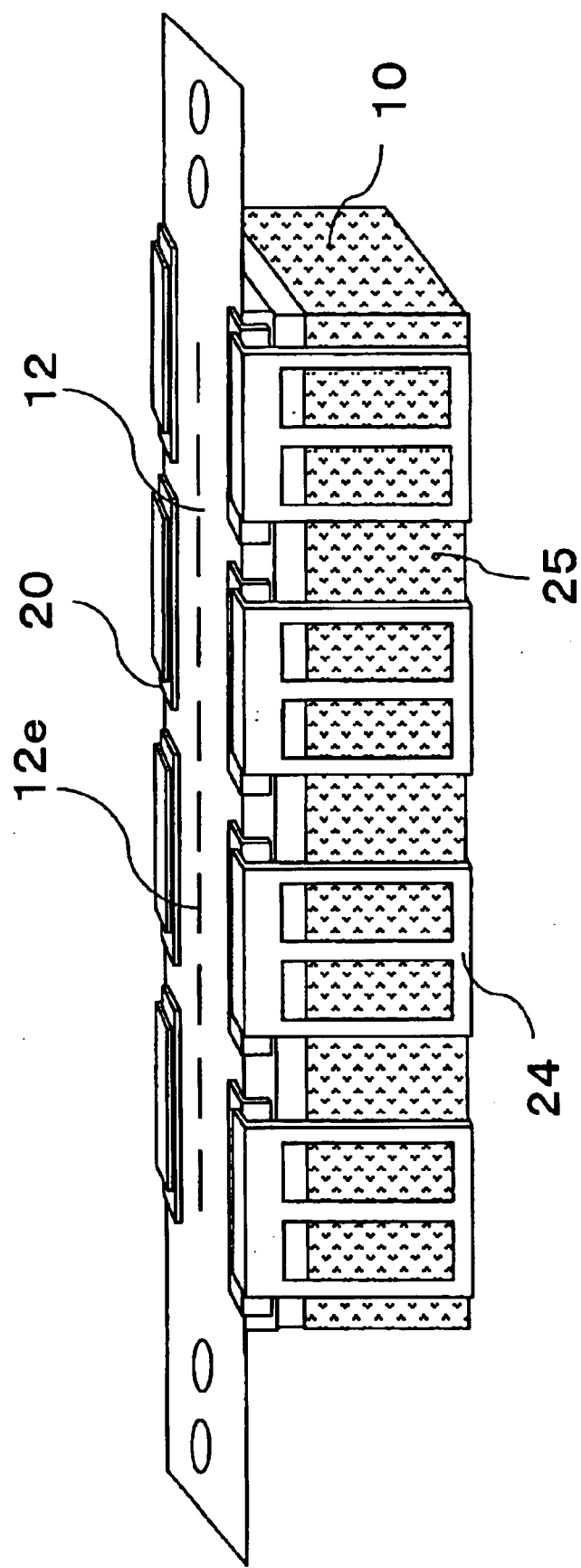
FIG. 4 is a view showing L-shaped angle members being disposed on side edge portions (corners) of an electric heater 12.

Referring to FIG. 4, L-shape angle members 20 are arranged along the side edges of the electric heater 12 in the longitudinal direction. The angle member 20 is made of quartz which is the same as that in the crucible 10, for example, and is disposed so as to cover the side edge portion (corner portion) of the electric heater 12. The angle member 20 is formed to have a length of about 9 cm, widths in the upper and side surfaces of about 5 mm, and a thickness of about 1 mm, for example, so as to accommodate the side edges on the upper and side surfaces of the electric heater 12 (which correspond to the upper end portion of the side surface of the crucible 10).

While in the illustrated example, four angle members 20 are provided on either side of the crucible 10 and a total of eight angle members 20 are provided on both sides thereof, the crucible 10 is actually longer than the shown example and generally has six or eight angle members 20 provided on either side. It should be noted, however, the number of angle members 20 depends on an apparatus. These angle members 20 are arranged evenly such that they can press the crucible 10 uniformly. Specifically, on either side of the crucible 10, the angle members 20 are arranged at substantially equal intervals along the longitudinal direction. Further, the corresponding angle members 20 on both sides of the crucible 10 are located at the same position in the longitudinal direction. In addition, while in the illustrated example, the angle member 20 located at one end in the longitudinal direction is disposed so that a distance corresponding to one half the interval between adjacent angle members 20 is maintained between the edge of that angle member 20 and the edge of the crucible 10, it is also preferable that the angle member 20 be disposed such that the edges of the angle member 20 and the crucible 10 match.

Further, the crucible 10, the electric heater 12, and the angle member 20 are pressed together for fixing by a clamp 24 toward the upper end of the crucible 10. In the illustrate example, the clamp 24 is slightly shorter than the length of the angle member 20 in the longitudinal direction of the crucible 10. The clamps 24 will be described in further detail below.

As described above, by using a plurality of angle members 20 and clamps 24 which function as fixing members to bring the elongated crucible 10 and the electric heater 12 into close contact with each other, even when the size of the elongated crucible 10 in the longitudinal direction changes in accordance with the size of the deposition object such as a substrate, it is possible to easily accommodate such a change simply by changing the number of angle members 20 and clamps 24, thereby facilitating manipulation and improving workability. Further, it is possible to position the angle members 20 and the clamps 24 so as to avoid the openings 12e formed on the upper portion of the electric heater 12, through which a deposition material is discharged, and the thermocouple provided on the electric heater 12, by simply adjusting the locations where the angle member 20 and clamps are to be disposed. In particular, it is preferable that the angle member 20 detours the position where the thermocouple is mounted.

Figure 5:
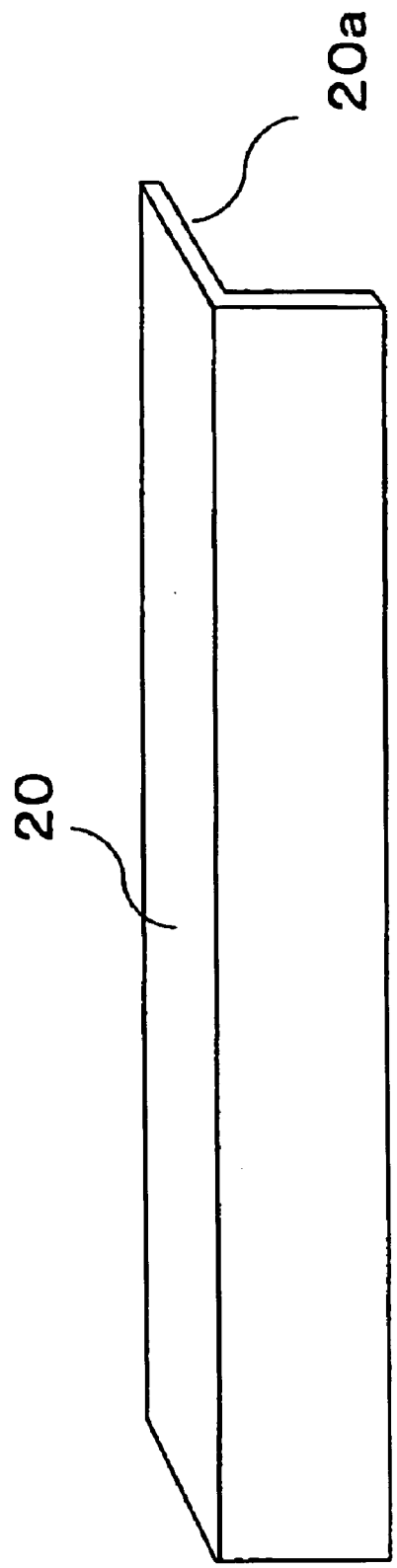
FIG. 5 is a perspective view showing the shape of an L-shaped angle member.

On the side edge portions of the electric heater 12 along the longitudinal direction, because the clamp 24 presses the electric heater 12 via the L-shaped angle member 20, the pressing force of the clamp 24 is distributed along the longitudinal direction of the L-shaped angle member 20 to thereby apply a uniform pressing force over the whole electric heater 12. In particular, the L-shaped angle member 20 has a shape as shown in FIG. 5, in which the inner surface 20a thereof which comes in contact with the electric heater 12 is sufficiently flat. Consequently, the electric heater 12 applies a uniform pressing force toward the crucible 10 on its surfaces contacting the L-shaped angle member 20.

Preferably, an even number of angle members 20 are provided, as in the illustrated example. For example, with respect to a crucible having a length of 60 cm, six or eight angle members (on either side of a crucible) is preferably provided, which results in a total of six or eight clamps 24. When an even number of angle members 20 are provided as described, it is possible to dispose thermocouples at the center and edge portions of the crucible 10 to measure a temperature within the crucible at the center portion. It should be noted, however, that an odd number of angle members 20 may be provided when desired.

The procedure for using the evaporation apparatus described above will next be described. First, an evaporation material is placed within the crucible 10, and the crucible 10 is covered with the electric heater 12. The L-shaped angle members 20 are then arranged so as to contact the corner of the electric heater 12. In this state, the crucible 10 and the electric heater 12 are fixed using the clamps 24. Consequently, the crucible 10 is sealed except the openings 12e formed on the electric heater 12. In this manner, preparation of evaporation is completed.

When forming a thin film, within a decompressed vacuum chamber, electric current is caused to flow through the electric heater 12 for raising the temperature of the electric heater 12. Because the electric heater 12 is formed by a uniform material as a structure which is uniform along the longitudinal direction for covering the crucible 10, heat is generated from the electric heater 12 uniformly over the longitudinal direction of the crucible 10.

The heat generated by the electric heater 12 is transmitted to the crucible 10 through the upper edge of the crucible in contact with the electric heater 12. Because the electric heater 12 is uniformly pressed onto the crucible 10, the heat is uniformly transmitted to the crucible 10 in the longitudinal direction. Further, the heat generated by the electric heater 12 is also transmitted to the crucible 10 and the evaporation material by radiation. Because the temperature of the electric heater 12 is uniform along the longitudinal direction, the electric heater 12 uniformly applies thermal radiation to the crucible 10 and the evaporation material in the longitudinal direction.

The heat transmitted to the crucible 10 via its upper edge in contact with the electric heater 12 is diffused, by conduction and radiation, throughout the entire crucible 10, thereby raising the temperature of the crucible 10 uniformly in the longitudinal direction in combination with direct radiation heat from the electric heater 12. The temperature of the evaporation material contained in the crucible 10 then rises due to the heat transmitted through contact with and heat radiation from the crucible 10. When the temperature of the evaporation material reaches or exceeds a predetermined value, the evaporation material vaporizes and the pressure within the crucible 10 increases, so that the gaseous evaporation material is discharged through the openings 12e of the electric heater 12. Because the temperature of the evaporation material is uniform along the longitudinal direction within the crucible 10, the evaporation material is uniformly discharged through the openings 12e linearly along the longitudinal direction. In this state, a substrate on which a thin film is to be formed is placed near the openings 12e of the electric heater 12. By moving the evaporation apparatus relative to the substrate in the direction perpendicular to the longitudinal direction of the crucible 10, gases of the evaporation material come into contact with the entire surface of the substrate under the same conditions, allowing formation of a two-dimensionally uniform thin film on the substrate.

Alternatively, the evaporation material may be deposited on the substrate using a mask rather than directly from the crucible 10. For an organic EL panel, for example, a mask having an opening corresponding to each pixel is often used for deposition of an emissive layer. When a mask is used, different angles formed between the evaporation source and the mask would provide different areas covered by the mask, which lowers patterning accuracy of the deposition layer. However, by moving the elongated crucible 10 relative to and under the substrate having the mask disposed thereon as in the present invention, the positional relationship among the source, the substrate, and the mask is substantially the same at any point on the substrate when performing deposition with respect to the point, thereby achieving uniform deposition.

As described above, according to the present embodiment, by providing the angle members 20 in the longitudinal direction of the elongated crucible 10 between the electric heater 12 and the clamps 24 and fixing the crucible 10 and the electric heater 12 using clamps 24, contact between the crucible 10 and the electric heater 12 can be ensured uniformly in the longitudinal direction of the crucible 10 by means of effect of the angle members 20. As a result, the distance between the electric heater 12 and the evaporation material within the crucible 10, the heating condition, and discharge of the evaporation material can be made relatively uniform. More specifically, it is possible to heat the evaporation material contained in the crucible 10 uniformly at any point in the longitudinal direction of the crucible 10 and reliably discharge the evaporation material through the opening of the crucible 10.

Although the L-shaped angle member 20 is formed from quartz in the above example, the member may be formed of another material having insulating property and low thermal conductivity, such as a ceramic material. Further, although the evenness of the inner surface 20a of the angle member 20 contacting the electric heater 12 depends on the material, thickness, and the like of the electric heater 12, it is desirable that the distance between a convex and a concave on the uneven surface is $\pm 100 \mu m$ or less, so that the angle member 20 can exert its pressing force uniformly over the entire region which is in contact with the electric heater 12.

Further, by forming the angle member 20 from a material having low thermal conductivity, it is possible to prevent heat from the thermal conductive electric heater 12 from being transmitted via the angle member 20 to the fixing member such as the clamp 24. This can further prevent heat discharge at the portions of the elongated crucible 10 in the longitudinal direction where the clamps 24 are disposed, thereby preventing partial change of the temperature within the crucible 10.

Also, the angle member 20 is insulative, at least at its surface, and provides electrical insulation between the electric heater 12 and the conductive clamp 24.

More specifically, when the fixing member such as the clamp 24 is conductive and the electric heater 12 and the fixing member are electrically connected, electrical current may flow through the fixing member which then generates heat, or the fixing member may deteriorate after the long-term use. According to the present embodiment, however, because the fixing member brings the electric heater 12 into contact with the crucible 10 via the angle member 20, it is possible to reliably achieve electrical insulation between the clamps 24 and the electric heater 12 by using the insulative angle member 20 as described above. Further, when a metal layer is provided around the outer periphery of the crucible 10 so as to facilitate more uniform heating of the interior of the crucible, as described below, it is also possible to prevent the metal layer contacting the fixing member from being electrically connected to the electric heater 12 by electrically insulating the fixing member from the electric heater 12 by the angle member 20. This prevents electric current from flowing in the metal layer and causing heat generation and deterioration.

When the crucible 10 is formed from quartz as described above, it is preferable that the angle member 20 also be quartz because the two components will then advantageously have an equal thermal expansion coefficient, or the like.

The clamp 24 serving as a fixing member for fixing the electric heater 12 onto the crucible 10 will be described.

Figure 6:
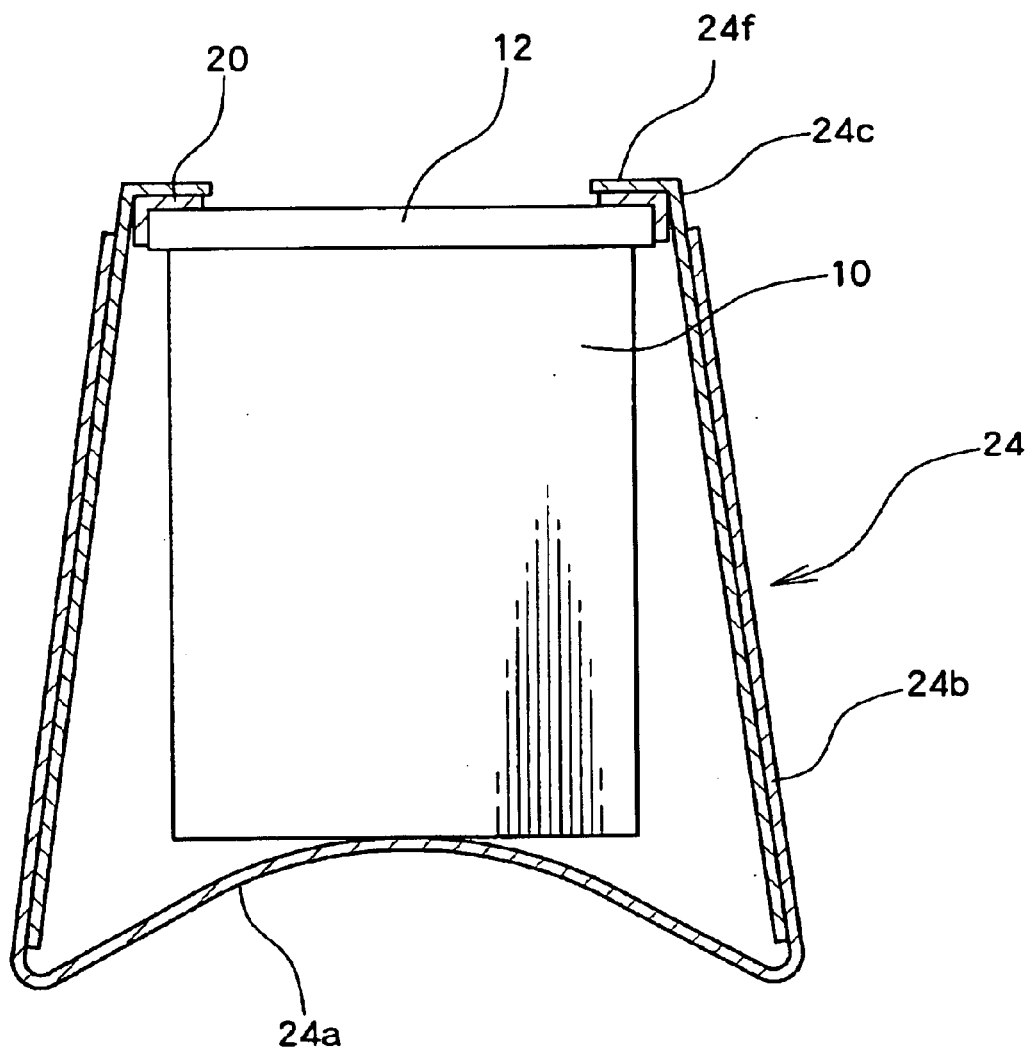
FIG. 6 is a cross sectional view showing a crucible, an electric heater, and an L-shaped angle member fixed together by means of a clamp.

Referring to FIG. 6 showing a cross sectional view perpendicular to the longitudinal direction of the crucible 10 and the electric heater 12, a clamp is formed by a curved portion 24a which is made from a spring member and is in contact with the bottom of the crucible 10, a pair of side surface portions 24b extending from both ends of the curved portion 24a to the vicinity of the upper edges of the crucible 10 along the side walls of the crucible 10, and two sheets of arm portions 24c which are welded to the side surface portions so as to overlap them. Each arm portion 24c includes a claw portion 24f extending toward the inner side at the upper end of the arm portion overlapping the side surface portion 24b, and the claw portion 24f comes in contact with the upper surface of the L-shaped angle member 20. While the distance between the lower portion of the clamp 24 and the side wall of the crucible 10 is shown to be relatively large in the drawing, the actual distance can be smaller because the force of the side surface portion 24b exerting toward the inner side need not be large.

The center of the curved portion 24a bulges upward, and the width of the curved portion 24a is greater than that of the crucible 10. When the clamp 24 is not attached to the crucible 10, the distance between the claw portion 24f and the uppermost portion of the curved portion 24a is smaller than the height of the crucible 10. Accordingly, when the clamp 24 is attached to the crucible 10, the clamp 24 applies pressing force between the bottom of the crucible 10 and the upper surface of the angle member 20 by means of the claw portions 24f and the curved portion 24a. Further, although transformation of the curved portion 24a also generates a pressing force toward the inner sides of the side surfaces of the angle members 20 at the upper portion of the arm portions 24c, such a force is relatively small. In addition, because the distance between the upper edge portions of the arm portions 24c, not including the claw portions 24f, is actually smaller than the width of the crucible 10, a pressing force toward the inner side is always applied at the upper edge of the side surface portions 24c when the clamp 24 is attached to the crucible 10.

As described above, when the claim 24 is attached to the crucible 10, the curved portion 24a transforms toward the outer side (lower side), so that the clamp 24 presses the angle member 20 onto the electric heater 12.

The curved portion 24a and the side surface portion 24b of the clamp 24 are preferably formed of a material having a small temperature change of a spring constant, such as Inconel (trademark) which is a nickel alloy, and are formed to have a thickness of about 0.4 mm, such that the pressing force does not change even when the crucible is heated. Further, the arm portion 24c contacting the upper surface of the L-shaped angle member does not require high spring force, and a material having high strength is preferably used. In this embodiment, the arm portion 24c is made of Inconel (trademark) and has a thickness of about 0.7 to 0.8 mm.

The clamp 24 is attached to the crucible 10, the electric heater 12, and the L-shaped angle member 20 in the following manner. First, the two arm portions 24c which are urged inward due to the spring material is opened outside. In this state, the crucible 10 on which the electric heater 12 and the angle member 10 are attached is inserted into the clamp 24. Then, while the two arm portions remain open, the curved portion 24c is pressed onto the bottom of the crucible 10 so as to transform the curved portion 24c. In this state, the two arm portions 24c are closed, and then the pressing force of the crucible 10 onto the bottom is released, thereby completing the attachment. It should be noted that, for attachment of the clamps 24, a dedicated jig may be preferably used.

Figure 7:
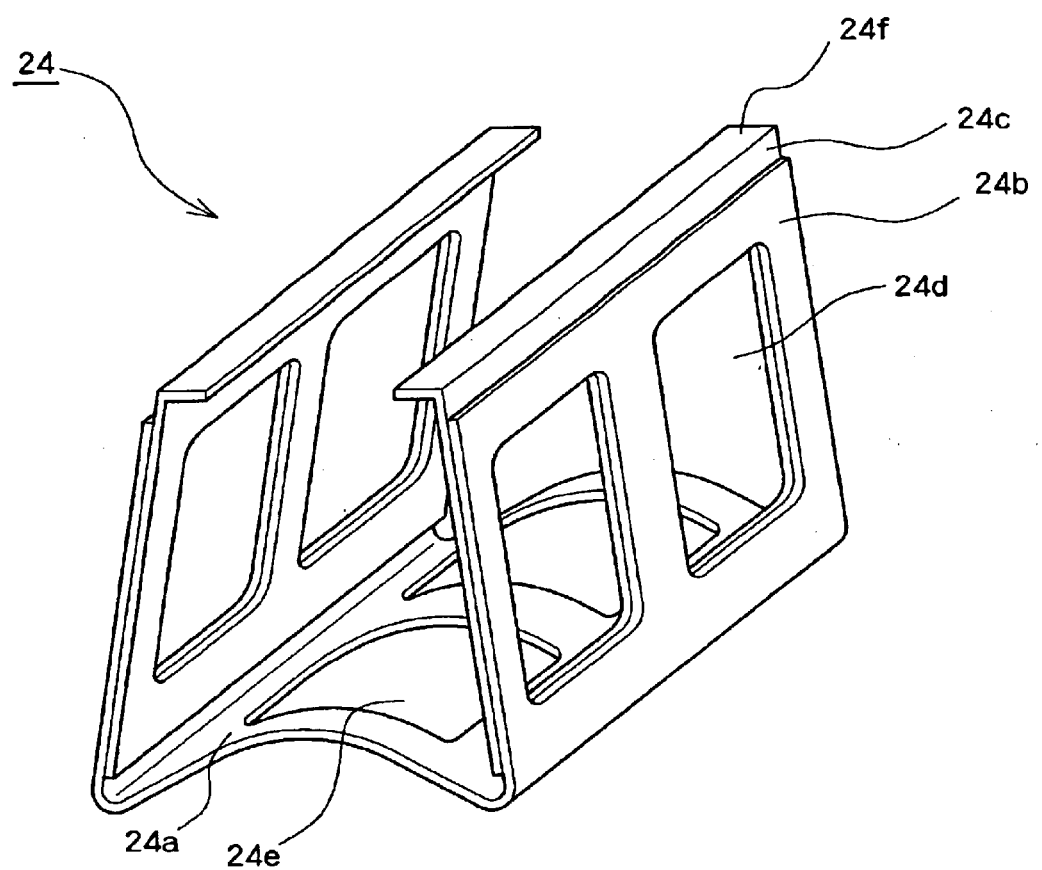
FIG. 7 is a perspective view showing the shape of a clamp.

Referring further to FIG. 7, it is desirable that the clamp 24 has openings 24d on the side surfaces and opening 24e on the bottom. By forming these openings 24d and 24e, it is possible to decrease the surface area of the clamp 24, thereby reducing heat discharge from this clamp 24. Consequently, the evaporation material can be vaporized by minimum heating using the electric heater 12, so that a variation in temperature within the crucible 10 can be suppressed. Further, the opening 24e also adjusts the pressing force of the clamp 24. Specifically, a larger opening 24e can reduce the pressing force, whereas a smaller opening 24e can increase the pressing force. It is thus possible to adjust the opening 24e such that the electric heater 12 can optimally seal the opening of the crucible in accordance with the strength of the electric heater 12, the size of the L-shaped angle member, or the like.

Further, it is desirable that the surface of the clamp 24 be processed by surface roughing such as sand blasting and shot blasting. A surface roughing treatment removes impurities adhered to the surface during the manufacturing process of the clamp 24, such that discharge of impure gas can be prevented, even in a high temperature environment during evaporation. In addition, because the surface roughing treatment enhances the adhesion between the clamp surface and the evaporation material adhered thereto during evaporation, it is possible to prevent the evaporation material attached to the clamp 24 from removing and dropping into the vacuum chamber.

As described above, according to the present embodiment, the electric heater 12 is pressed and fixed with respect to the crucible 10 using the clamps 24. Here, because a great number of identical clamps 24 can be manufactured, any clamp 24 will apply substantially the same pressing force for fixing. While it was very likely that the pressing force varies for each operation performed by an operator when a wire is used in place of the clamps 24 for fixing, such a problem is overcome when the clamps 24 of the present invention are employed. Further, as the operation using a jig is simple, it is possible to increase working efficiency.

Further, the electric heater 12 can be detached from the crucible 10 by removing the clamps 24. After the evaporation material is added into the crucible 10 in this state, the clamps 24 are attached once again, so that fixing can be performed. Although, when a wire is used for fixing, it is not effective to reuse a wire which has been detached once, the clamps 24 can be reused repeatedly.

In addition, the area of the claw portion 24f of the clamp 24 is substantially the same as that of the upper surface of the angle member 20, so that pressing force can be uniformly applied to the angle member 20.

Figure 8:
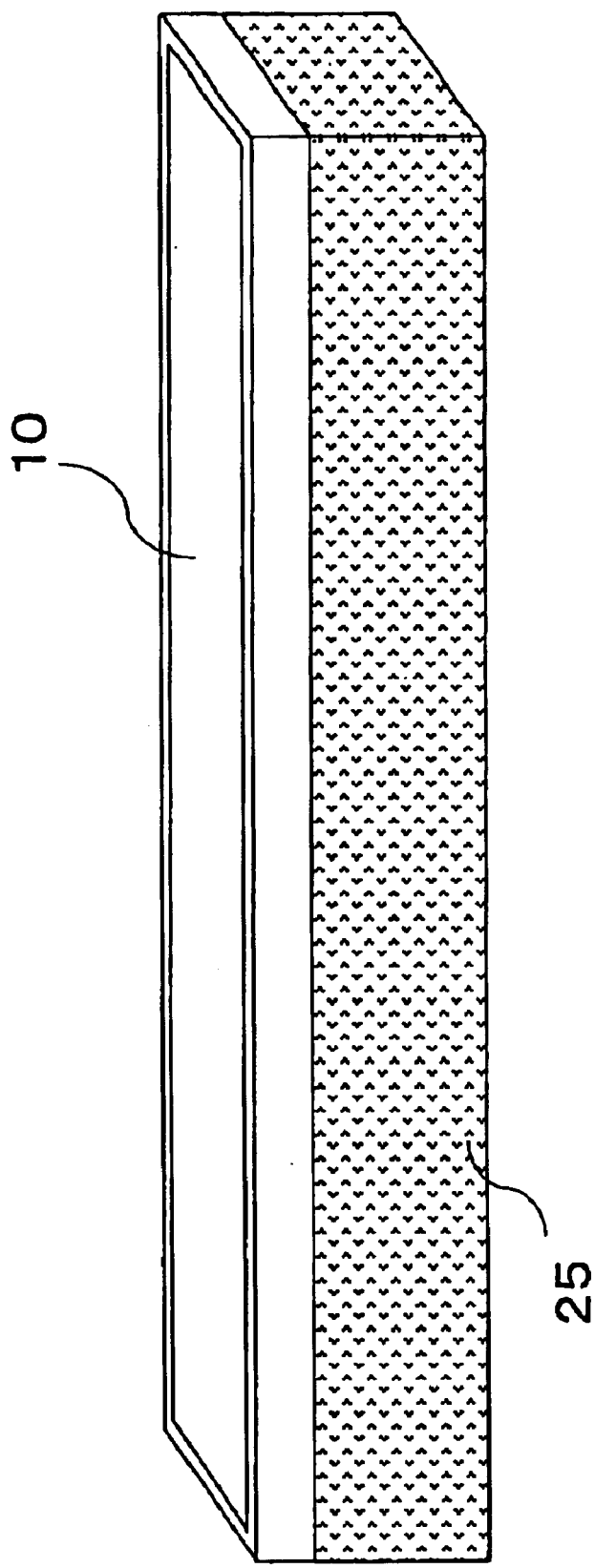
FIG. 8 is a perspective view showing a crucible having a metal coating applied thereon.
Figure 9:
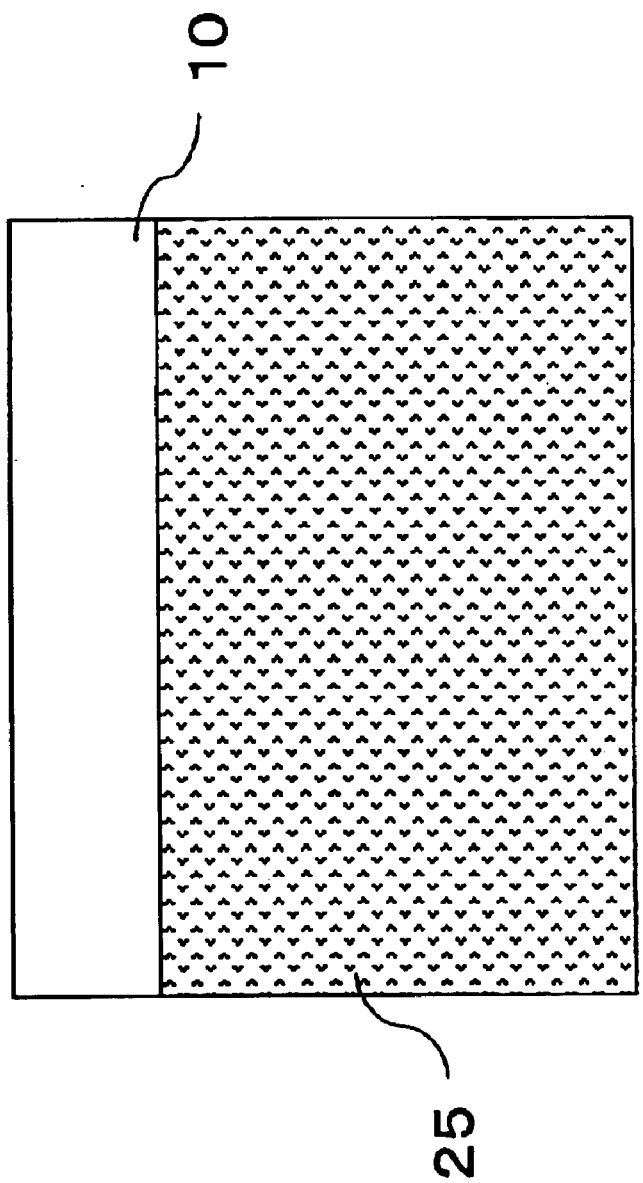
FIG. 9 is a side view of a crucible showing the height of the metal coating applied to the crucible.

Referring further to FIG. 8 showing the side surface of the crucible 10 in the longitudinal direction and FIG. 9 showing the side surface of the crucible in the width direction, a metal coating 25 may be applied to the outer periphery of the crucible 10. The metal coating 25 has substantially uniform thickness, and is applied on the bottom and on side wall of the crucible 10 to substantially the uniform height.

With the above structure, the heat which is generated by the electric heater 12 and transmitted to the crucible 10 by radiation and thermal conduction due to contact is subject to re-radiation and diffusion conduction via the metal coating 25 having high infrared reflectivity and thermal conductivity, enhancing the uniformity of the temperature in the crucible 10.

It is desirable that the upper edge of the metal coating 25 provided on the side walls of the crucible 10 be located above the height of the evaporation material contained in the crucible 10 and below the upper edge of the crucible 10. Such a structure facilitates effective heating of the evaporation material, and also prevents electrical contact between the electric heater 12 covering the opening of the crucible and the metal coating 25. In the illustrated example, the metal coating provided on the side wall of the crucible has a height of approximately 4 cm, and is spaced from the lower edge of the electric heater 12 by approximately 2 mm.

Further, it is desirable that the metal coating 25 is aluminum having good infrared reflectivity and thermal conductivity. Although a copper and alumina coating was also manufactured and tested, it was found that more uniform film formation using an evaporation material could be performed with an aluminum coating than with a copper and alumina coating.

Preferably, the aluminum coating is obtained by direct coating onto the crucible using, for example, thermal spraying. More specifically, the coating formed by thermal spraying is directly accumulated on the side surface of the crucible 10, so that the interior of the crucible 10 can be maintained to a uniform temperature. The thickness of the aluminum coating is approximately 150 μm, for example.

When the clamp 24 as described above is used, the curved portion 24a of the metal clamp 24 is in contact with the bottom surface of the crucible 10 where the metal coating 25 is applied. However, because the angle member 20 is provided between the clamp 24 and the electric heater 12 as described above, it is possible to prevent electric current from flowing into the metal coating 25.

Figure 10:
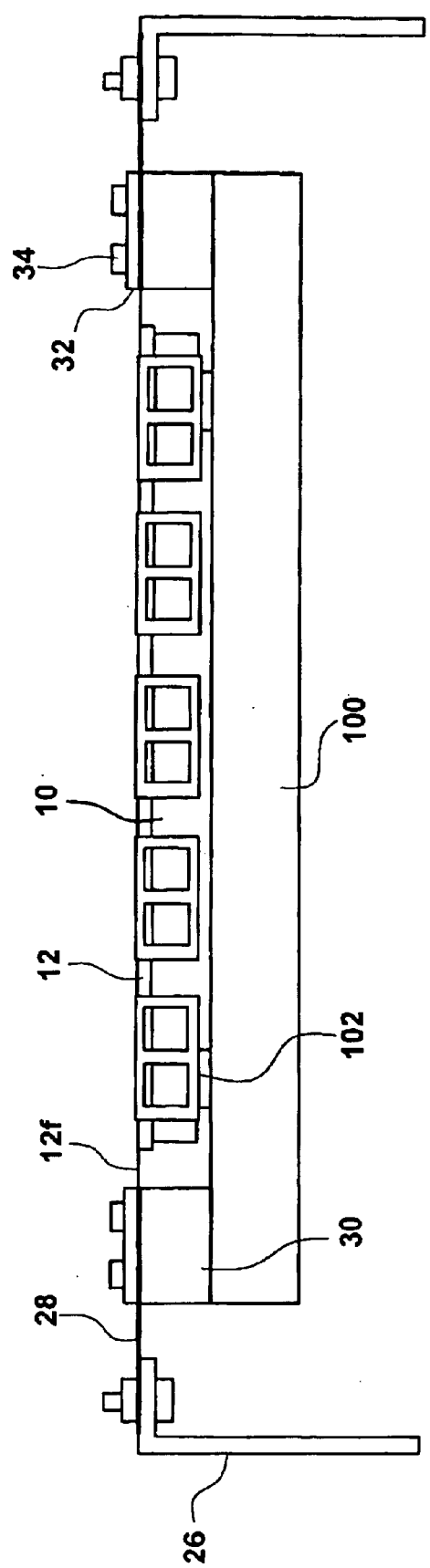
FIG. 10 is a view showing a structure of an evaporation apparatus within a vacuum chamber.

The evaporation apparatus as described above will be disposed within a vacuum chamber as shown in FIG. 10.

Within a vacuum chamber, the crucible 10 is placed on a supporting mount 100 via a leg 102. The tongue portions 12f at both ends of the electric heater 12 are electrically connected to connecting plates 28 respectively at heater holders 30. The connecting plates 28 are further connected electrically to a pair of electrodes 26, respectively, which extend from the body of the evaporation apparatus and then bend toward the heater holder 30 at a height substantially corresponding to the height of the upper surface of the heater holder 30. The pair of electrodes 26 also moves along with the supporting mount 100, the crucible 10, and the like. Further, in this example, the connecting plate 28 extends from the heater holder side onto the upper surface of the electrode 26 which is bent toward the heater holder 30, and the connecting plate 28 and the electrode 26, which thus overlap with each other, are connected by bolting.

The supporting mount 100, together with the electrodes 26, translates in the vertical direction with respect to the longitudinal direction of the crucible 10. A substrate used for evaporation is fixed above the crucible 10. The crucible 10 horizontally moves in the vertical direction with respect to the longitudinal direction of the crucible 10, for accumulating an evaporation material on the substrate (a surface of the substrate facing the crucible, namely the lower surface of the substrate in this example). Thus, a uniform deposition layer is formed on the entire surface of the substrate, which is fixed.

When a plurality of evaporation materials are evaporated from different crucibles 10, the plurality of crucibles 10 are arranged in alignment with each other and are moved appropriately so as to perform evaporation.

Figure 11:
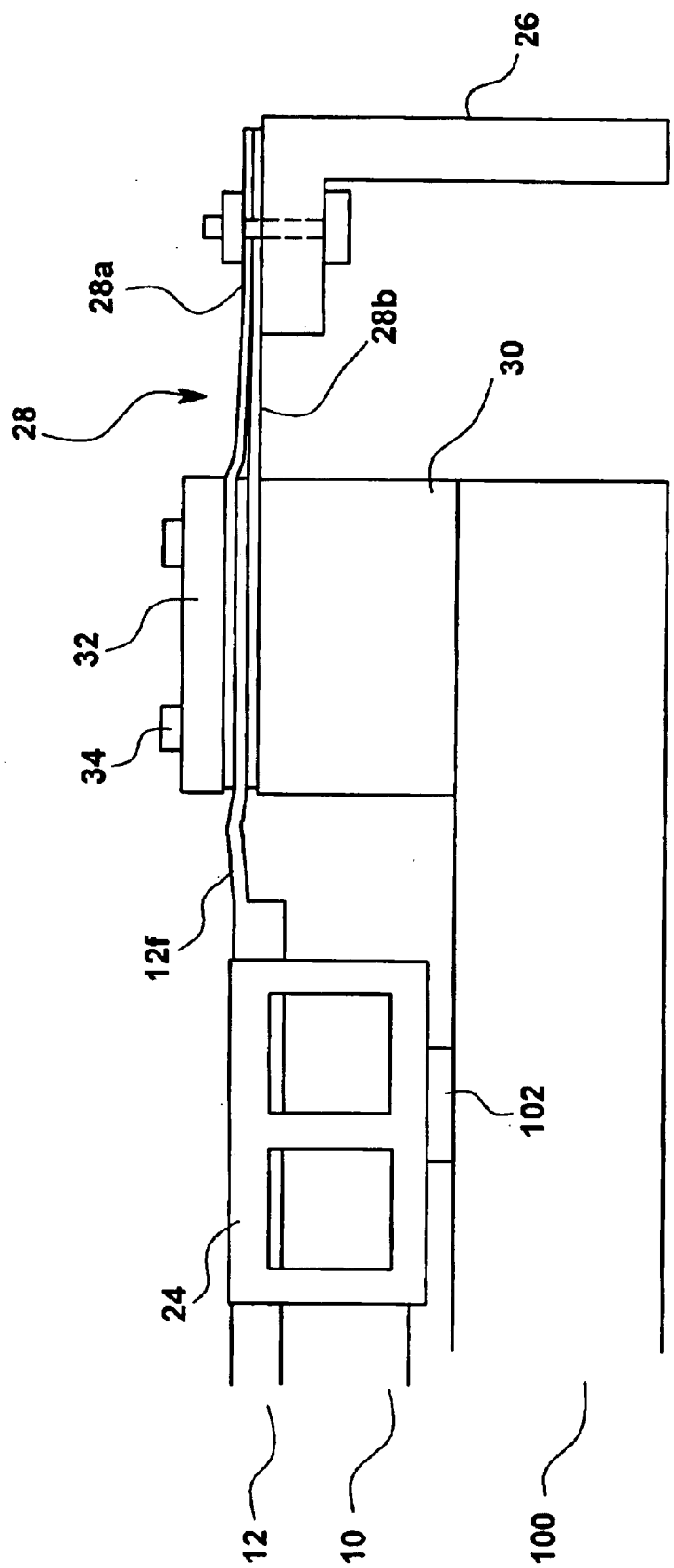
FIG. 11 is a view showing an electrical connection between the electric heater and the electrode via a connecting plate.

FIG. 11 is an enlarged view showing the heater holder 30. The tongue portion 12f of the electric heater 12 and the connecting plate 28 are layered and fixed using a bolt 34 via a copper plate 32 at the heater holder 30. Thus, plane contact is achieved between the tongue portion 12f and the connecting plate 28 for electrical connection. The electrical connection between the electric heater 12 and the connecting plate 28 can be broken by releasing the fixing at the heater holder 30. At this state, the electric heater 12 can be removed from the crucible 10. More specifically, in a state where the fixing is released, the fixing means such as the clamp 24 is detached to thereby remove the electric heater 12 from the crucible 10, and then periodic replenishment of an evaporation material into the crucible 10 is performed.

It is preferable that the connecting plate 28 be formed by a resistive heating metal plate 28a and a highly conductive metal plate 28b.

With a combination of the resistive heating metal plate 28a and the highly conductive metal plate 28b, the temperature of the crucible 10 can be made constant in the longitudinal direction. More specifically, the temperature of the crucible 10 at the end portions is affected by heat radiation from the end portions of the crucible 10, Joule heat generated at the tongue portion of the electric heater 12 and at the connecting plate 28, heat transmitted from the tongue portion 12f of the electric heater to the heater holder 30 and further transmitted from the connecting plate 28 to the electrode 26, or the like. Accordingly, the electric heater 12 does not have the uniform temperature at the center portion and the end portions. According to the present embodiment, because the connecting plate 28 uses a combination of the resistive heating metal plate 28a and the highly conductive metal plate 28b, it is possible to adjust heat generation at the connecting plate 28 and heat transmission through the connecting plate 28, so that the temperature of the crucible 10 can be made constant over the longitudinal direction.

Experiments performed by the present inventor demonstrated that the temperature of the crucible 10 could be made uniform over the longitudinal direction thereof when tantalum (Ta) was used for the resistive heating metal plate 28a and copper (Cu) was used for the highly conductive metal plate 28b.

Further, it is preferable that a region of the highly conductive metal plate 28b forming plane contact with the tongue portion 12f of the electric heater 12 is gold plated. Because tantalum (Ta) used for the electric heater 12 is a hard material, the effective contact area between the electric heater 12 and the highly conductive metal plate 28b made of copper, for example, is small, and also the contact resistance between the electric heater 12 and the connecting plate 28 significantly changes each time the electric heater 12 is attached. By applying gold plating onto this contact region, the shape of the gold transforms to conform with the uneven surface of the tongue portion 12f of the electric heater 12, such that the effective contact area can be increased and the contact resistance can be further stabilized.

In addition, the connecting plate 28 is formed as a thin plate such that it can bend. With this structure, even when electric current flows in the electric heater 12 to raise the temperature of the electric heater 12 and cause thermal expansion of the electric heater 12, the heater holder 30 moves in the longitudinal direction, and sealing of the upper portion of the crucible 10 and the electrical connection between the electric heater 12 and the connecting plate 28 can be secured.

While in the above example the resistive heating metal plate 28a is provided above the electric heater 12 and the highly conductive metal plate 28b is provided below the electric heater 12 to form a layered structure, the positional relationship between these metal plates 28a and 28b may be reversed. In this case, however, it is preferable that the connecting plate 28 is bent in the opposite direction so that the highly conductive metal plate 28b in which more electric current flows comes into direct contact with the electrode 26 to which electric current is supplied from the body of the evaporation apparatus.

As described above, according to the present embodiment, as the connecting plate 28 is formed by a plurality of metals, it is possible to appropriately adjust the resistance value of the connecting plate 28, and to also adjust the heating amount at the connecting plate 28. It is therefore possible to appropriately adjust the temperature of the electric heater 12 at the end portions, so that the evaporation material within the crucible 10 can be heated and vaporized uniformly. Consequently, the evaporation material can be discharged uniformly over the longitudinal direction through a plurality of openings 12e. Here, the evaporation material is typically powder, and can normally be classified as either a material which is melted and evaporated by heating or a material which is sublimated and vaporized by heating. Alternatively, other evaporation materials are liquid, and are evaporated for vaporization by heating.

Accordingly, when the above evaporation apparatus is used for evaporation with respect to a relatively large substrate of an organic EL panel or the like, a uniform thin film can be formed on the substrate by moving the evaporation apparatus in the vertical direction along the longitudinal direction of the crucible 10.

In addition, application of gold plating on the plane contact region between the connecting plate 28 and the electric heater 12 ensures reliable plane contact between these members. It is therefore possible to reduce the contact resistance between the connecting plate 28 and the electric heater 12, with good repeatability, before and after attachment and detachment of the electric heater 12 for replenishment of the evaporation material.

In particular, by using tantalum, which is also used for the electric heater 12, as the resistive heating metal plate 28a and using gold plated copper as the highly conductive metal plate 28b, appropriate heating of the evaporation material can be performed by the electric heater 12.

While the preferred embodiment of the present invention has been described using specific terms, such description is for illustrative purposes only, and it is to be understood that changes and variations may be made without departing from the spirit or scope of the appended claims.

What is claimed is:

1. An evaporation apparatus comprising:
    an elongated crucible having an upper opening and storing an evaporation material; and
    an electric heater which covers the upper opening of the elongated crucible, generates heat by causing electric current to flow therein for heating the evaporation material stored in the crucible, and has an opening through which can pass the evaporation material which is vaporized by heating,
    wherein a metal coating is applied to the outer surface of the elongated crucible.

2. An evaporation apparatus according to claim 1, wherein the metal coating is an aluminum material.

3. An evaporation apparatus according to claim 2, wherein
    the metal coating is applied from the bottom of the crucible to a substantially uniform height of side walls of the crucible.

4. An evaporation apparatus according to claim 2, wherein the metal coating is formed by thermal spraying.

5. An evaporation apparatus according to claim 1, wherein
    the metal coating is applied from the bottom of the crucible to a substantially uniform height of side walls of the crucible.

6. An evaporation apparatus according to claim 1, wherein the metal coating is formed by thermal spraying.

7. An evaporation apparatus for evaporating and depositing an evaporation material to a target object, the apparatus comprising:
    an elongated crucible having an upper opening and storing an evaporation material; and
    an electric heater which covers the upper opening of the elongated crucible, generates heat by causing electric current to flow therein for heating the evaporation material stored in the crucible, and has an opening through which can pass the evaporation material which is vaporized by heating,
    wherein a metal coating is applied to the outer surface of the elongated crucible.

8. An evaporation apparatus comprising:
    an elongated crucible having an upper opening and storing an evaporation material;
    an electric heater which covers the upper opening of the elongated crucible, generates heat by causing electric current to flow therein for heating the evaporation material stored in the crucible, and has an opening through which can pass the evaporation material which is vaporized by heating; and
    a fixing member for pressing and fixing the electric heater onto the elongated crucible,
    wherein
    a metal coating is applied to the outer surface of the elongated crucible,
    between the fixing member and the electric heater, an angle member having surface portions respectively fitting onto an edge portion of the upper surface and an upper portion of the side surface of the electric heater and is insulative at least in a surface thereof is provided along the longitudinal direction of the elongated crucible, and
    pressing force from the fixing member is caused to exert onto the electric heater via the angle member for bringing the electric heater into close contact with the elongated crucible.

9. An evaporation apparatus according to claim 8, wherein,
    the angle member is longer than a pressing portion of the fixing member which presses the angle member in the longitudinal direction of the crucible.

10. An evaporation apparatus according to claim 8, wherein
    the angle member is formed of a material having a lower thermal conductivity than the fixing member.

11. An evaporation apparatus according to claim 8, wherein the metal coating is an aluminum material.

12. An evaporation apparatus according to claim 8, wherein
    the metal coating is applied from the bottom of the crucible to a substantially uniform height of side walls of the crucible.

13. An evaporation apparatus according to claim 8, wherein the metal coating is formed by thermal spraying.

* * * * *